US012763733B2

(12) United States Patent
Chien et al.

(10) Patent No.: US 12,763,733 B2
(45) Date of Patent: Oct. 13, 2026

(54) CASCODE AMPLIFIER WITH DYNAMIC BODY BIAS AND METHOD THEREOF

(71) Applicant: Realtek Semiconductor Corp., Hsinchu (TW)

(72) Inventors: Ting-Hsu Chien, San Jose, CA (US); Chia-Liang (Leon) Lin, Fremont, CA (US)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 451 days.

(21) Appl. No.: 18/400,013

(22) Filed: Dec. 29, 2023

(65) Prior Publication Data

US 2025/0219591 A1 Jul. 3, 2025

(51) Int. Cl.
*H03F 1/32* (2006.01)
*H03F 3/16* (2006.01)

(52) U.S. Cl.
CPC ............. *H03F 1/3205* (2013.01); *H03F 3/16* (2013.01)

(58) Field of Classification Search
None
See application file for complete search history.

(56) References Cited

U.S. PATENT DOCUMENTS 6,765,443 B2 7/2004 Pehike
7,221,218 B2 * 5/2007 Yang .................. H03F 3/45188 330/98

* cited by examiner

*Primary Examiner* — Andrea Lindgren Baltzell
*Assistant Examiner* — Malane Lieng
(74) *Attorney, Agent, or Firm* — McClure, Qualey & Rodack, LLP

(57) ABSTRACT

A cascode amplifier comprises: a common-source amplifier includes a first MOST (metal-oxide semiconductor transistor) of a first type configured to receive a first input signal and output a first current to a first node in accordance with a body voltage applied at a body of the first MOST of the first type; a first common-gate amplifier comprising a second MOST of the first type and configured to receive the first current from the first node and output a second current to a second drain node in accordance with a first gate voltage; a dynamic body voltage generator configured to receive the first input signal and output the body voltage; and a load configured to establish a third voltage at a third drain node in response to the second current through a DC (direct current) path between the second drain node and the third drain node.

19 Claims, 2 Drawing Sheets

CASCODE AMPLIFIER WITH DYNAMIC BODY BIAS AND METHOD THEREOF

BACKGROUND OF THE INVENTION

Field of the Invention

The present invention generally relates to amplifier and more particularly to cascode amplifier with dynamic body bias.

Description of Related Art

Persons of ordinary skill in the art understand terms and basic concepts related to microelectronics that are used in the context of this disclosure, such as "voltage," "current," "signal," "differential," "single-ended," "capacitor," "inductor," "resistor," "transistor," "MOST (metal-oxide semiconductor transistor)," "PMOST (p-channel metal-oxide semiconductor transistor)," "NMOST (n-channel metal-oxide semiconductor transistor)," "AC (alternating current)," "DC (direct current)," "DC couple," "AC couple," "source," "gate," "drain," "body," "node," "ground node," "power supply node," "bias," "cascode," "common-source amplifier," "common-gate amplifier," "load," "impedance," and "cascode amplifier." Terms and basic concepts like these in the context of this present disclosure are apparent to those of ordinary skill in the art and thus will not be explained in detail.

Those of ordinary skill in the art can recognize a resistor symbol, a capacitor symbol, an inductor symbol, and a MOST (metal-oxide semiconductor transistor) symbol, for both PMOST (p-channel metal-oxide semiconductor transistor) and NMOST (n-channel metal-oxide semiconductor transistor), and can identify a "source" terminal, a "gate" terminal, a "drain" terminal, and a "body" terminal of a MOST. For brevity, in this present disclosure, in a context of reference to a MOST, a "source terminal" is simply referred to as "source," a "gate terminal" is simply referred to as "gate," a "drain terminal" is simply referred to as "drain," and a "body terminal" is simply referred to as "body." A MOST has a threshold voltage and is turned on when a gate-to-source voltage is greater than the threshold voltage; the threshold voltage of the MOST is affected by a voltage at its body, and this phenomenon is known as the "body effect."

Those of ordinary skill in the art can read schematics of a circuit comprising resistors, capacitors, inductors, NMOST, and PMOST, and do not need a verbose description about how one transistor, resistor, inductor, or capacitor connects with another in the schematics.

A cascode amplifier comprises a cascade of a common-source amplifier embodied by a first NMOST (n-channel metal-oxide semiconductor transistor) and a common-gate amplifier embodied by a second NMOST; a source of the first NMOST connects to a ground node, thus embodying a common-source amplifier; a gate of the second NMOST connects to a bias node of a substantially stationary voltage, thus embodying a common-gate amplifier; the first NMOST converts an input voltage (received from its gate) into an internal current (output via its drain), whereas the second NMOST relays the internal current (received from its source) into an output current (output via its drain), resulting an output voltage across a load attached to a drain of the second NMOST. What is desired is that a change of the input voltage can lead to a proportional change of the output voltage. In practice, however, the change of the output voltage may not be proportional to the change of the input voltage, in particular when the change of the input voltage is large. This is inevitable because: first, a NMOST obeys a square law, wherein a drain current is approximately proportional to a square of a difference between a gate-to-source voltage and a threshold voltage; and second, the NMOST is subject to channel length modulation, wherein the drain current is modulated by a drain-to-source voltage.

What is desired is a method to improve linearity of a cascode amplifier.

BRIEF SUMMARY OF THIS INVENTION

An objective of this present invention is to improve linearity of a cascode amplifier using a dynamic body bias technique.

Another objective of this present invention is to improve power efficiency of a cascode amplifier using a dynamic body bias technique.

In an embodiment, a cascode amplifier comprises: a common-source amplifier (CSA) comprising a first MOST (metal-oxide semiconductor transistor) of a first type configured to receive a first input signal and output a first current to a first drain node in accordance with a body voltage applied at a body of the first MOST of the first type; a first common-gate amplifier (CGA) comprising a second MOST of the first type and configured to receive the first current from the first drain node and output a second current to a second drain node in accordance with a first gate voltage; a dynamic body voltage generator configured to receive the first input signal and output the body voltage; and a load configured to establish a third voltage at a third drain node in response to the second current through a DC (direct current) path between the second drain node and the third drain node, wherein: the dynamic body voltage generator comprises a third MOST of a second type configured to output a dynamic current in accordance with the first input signal, and a resistor configured to establish the body voltage in response to the dynamic current. In a further embodiment, the cascode amplifier further comprises a dynamic gate voltage generator configured to receive the input signal and output the first gate voltage.

In an embodiment, a method of signal amplification comprises: receiving a first input signal; converting the first input signal into a first current directed to a first drain node DN1 using a common-source amplifier (CSA) comprising a first MOST (metal-oxide semiconductor transistor) of a first type, wherein a source, a gate, a drain, and a body of the first MOST of the first type connect to a first DC (direct current) node, the first input signal, the first drain node, and a body voltage, respectively; relaying the first current into a second current directed to a second drain node using a first common-gate amplifier (CGA) comprising a second MOST of the first type, wherein a source, a gate, and a drain of the second MOST of the first type connect to the first drain node, a first gate voltage, and the second drain node, respectively; adjusting the body voltage using a third MOST of a second type configured in a common-source amplifier topology to receive an AC (alternate current) coupling of the first input signal and output the body voltage; and establishing a third drain voltage at a third drain node by directing the second current to the third drain node through a DC (direct current) path and terminating the third drain node with a load comprising an inductor configured to provide DC coupling between the third drain node and a second DC node.

DETAILED DESCRIPTION OF THIS INVENTION

Figure 1:
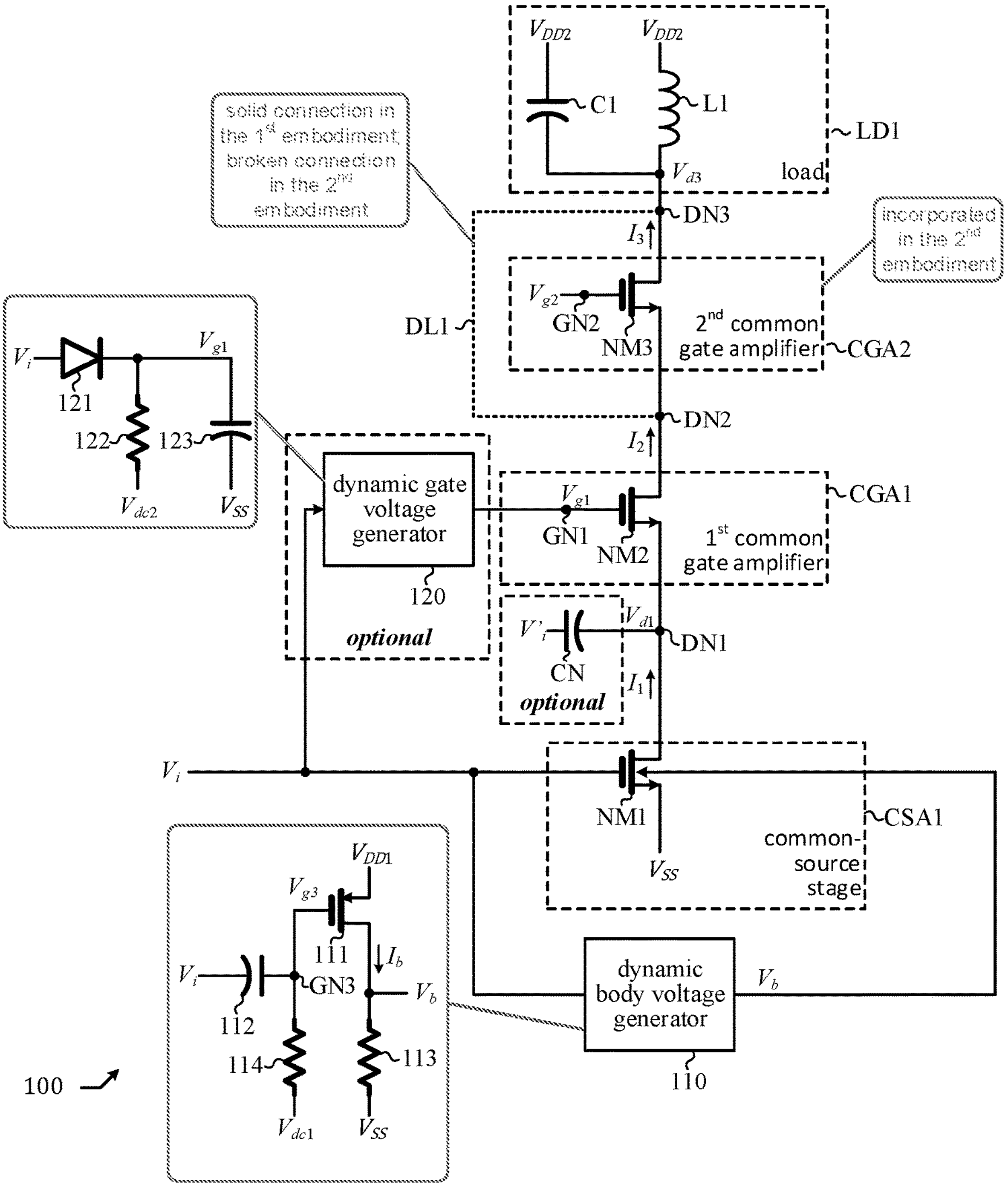
FIG. 1 shows a schematic diagram of a cascode amplifier in accordance with an embodiment of the present invention.

The present invention relates to cascode amplifiers. While the specification describes several example embodiments of the invention considered favorable modes of practicing the invention, it should be understood that the invention can be implemented in many ways and is not limited to the particular examples described below or to the particular manner in which any features of such examples are implemented. In other instances, well-known details are not shown or described to avoid obscuring aspects of the invention.

Throughout this disclosure, "DC" stands for direct current, and "AC" stands for alternating current. A DC voltage refers to a substantially stationary voltage. An AC voltage refers to a voltage that varies with time in an oscillatory manner and is also referred to as a dynamic voltage. In general, a voltage signal comprises a DC component and an AC component; the former is substantially stationary and remain fixed in a time duration of interest; and the latter is dynamic and can vary with time in the time duration of interest. Hereafter, for brevity, a swing of an AC component of a voltage signal is simply referred to as an "AC swing."

A DC node is a node of a substantially stationary voltage. Throughout this disclosure, "$V_{DD}$" denotes a first special DC node referred to as a power supply node, and "$V_{SS}$" denotes a second special DC node referred to as a ground node. When there are more than two power supply nodes, "$V_{DD1}$" denotes a first power supply node and "$V_{DD2}$" denotes a second power supply node. The first power supply node "$V_{DD1}$" and the second power supply node "$V_{DD2}$" could have the same static voltage level and also could have different static voltage levels.

A common-source amplifier is embodied by a MOST configured to receive an input voltage from its gate and output an output current via its drain, wherein its source is connected to a DC node.

A common-gate amplifier is embodied by a MOST configured to receive an input current from its source and output an output current via its drain, wherein its gate is connected to a bias node, a voltage at which is equal to a bias voltage that is substantially stationary.

A cascode amplifier is a cascade of a common-source amplifier and a common-gate amplifier, wherein an output current of the common-source amplifier is an input current of the common-gate amplifier.

A circuit is a collection of a transistor, a capacitor, an inductor, a resistor, and/or other electronic devices interconnected in a certain manner to embody a certain function. A network is a circuit or a collection of circuits configured to embody a certain function.

In this present disclosure, a "circuit node" is simply referred to as a "node" for short, as the meaning is clear from a context of microelectronics and won't cause confusion.

In this present disclosure, a signal is a voltage of a variable level that can vary with time. A (voltage) level of a signal at a moment represents a state of the signal at that moment.

Reference is made to FIG. 1, which shows a cascode amplifier 100 in accordance with various embodiments. As will be described hereinbelow, certain components illustrated in FIG. 1 are optional and are not necessary for the broader embodiments of the invention.

As shown in FIG. 1, a cascode amplifier 100 in accordance with an embodiment of the present disclosure comprises: a common-source amplifier CSA1 comprising a first NMOST NM1 and configured to receive an first input signal$V_i$ and output a first current $I_1$ to a first drain node DN1 in accordance with a body voltage $V_b$; a dynamic body voltage generator 110 configured to generate the body voltage $V_b$ in response to the first input signal $V_i$; a first common-gate amplifier CGA1 comprising a second NMOST NM2 and configured to receive the first current $I_1$ via the first drain node DN1 and output a second current $I_2$ to a second drain node DN2 in accordance with a first gate voltage $V_{g1}$; and a load LD1 comprising a parallel connection of a first inductor L1 and a first capacitor C1 and configured to establish a third drain voltage $V_{d3}$, which is an output voltage of the cascode amplifier 100, at a third drain node DN3 in response to the second current $I_2$ via a DC (direct current) path between the second drain node DN2 and the third drain node DN3.

In a first embodiment of said DC path, node DN3 is directly connected to node DN2, such that the two nodes are shorted together. That is, the dashed line DL1 shown in FIG. 1 is a solid connection between the second drain node DN2 and the third drain node DN3. In a second embodiment of said DC path, dashed line DL1 is broken, a second common-gate amplifier CGA2 is incorporated and inserted between the second drain node DN2 and the third drain node DN3, and configured to transport the second current $I_2$ into a third current $I_3$ directed to the third drain node DN3 in accordance with a second gate voltage $V_{g2}$.

A purpose of the dynamic body voltage generator 110 is to make the body voltage $V_b$ higher when the first input signal $V_i$ has a larger AC (alternating current) swing. The dynamic body voltage generator 110 comprises a PMOST 111, an AC (alternating current) coupling capacitor 112, a first resistor 113, and a second resistor 114. PMOST 111 is configured in a common-source amplifier topology, wherein the first input signal $V_i$ is coupled to its gate via the AC coupling capacitor 112, the body voltage $V_b$ is output at its drain, and its source is connected to a first power supply node $V_{DD1}$. The first resistor 113 is configured to be a load of PMOST 111. The second resistor 114 is configured to provide DC (direct current) coupling between a first DC bias node $V_{dc1}$ and the gate of PMOST 111 to establish a third gate voltage $V_{g3}$, which comprises a DC component equal to a voltage level of $V_{dc1}$ and an AC component proportional to an AC component of the first input signal $V_i$. As far as the circuit topology and function are concerned, the dynamic body voltage generator 110 is clear to those of ordinary skill in the art and thus not further explained in detail here.

When the AC component of $V_i$ is larger, $V_{g3}$ will have a larger swing, causing an output current $I_b$ of PMOST 111 to have a larger average level, thanks to the square law of current associated with a MOS transistor. As a result, an average level of $V_b$ is higher, causing NMOST NM1 to have a lower threshold voltage and consequently a higher overdrive voltage thanks to the "body effect"; consequently, the first NMOST NM1 is effectively biased deeper into a class-A region to handle a larger input swing and thus more linear. Concepts of "class-A region" and that "a MOST biased deeper into a class-A region can handle a larger input swing and be more linear" are well understood by those of ordinary skill in the art and thus not further explained in detail here. In a nutshell, a biasing condition of CSA1 is dynamically adjusted in accordance with the first input signal $V_i$ by taking advantage of the body effect, so that CSA1 will be biased deeper into the class-A region when an AC swing of $V_i$ is larger. Biasing a transistor into a deeper class-A region can lead to higher linearity at the expense of higher power consumption; however, NMOST NM1 is biased into a deeper class-A region only when an AC swing of $V_i$ is larger, and therefore higher power consumption occurs only when it's needed to handle the larger AC swing. As opposed to biasing CSA1 deeper into the class-A region regardless of the AC swing of $V_i$, CSA1 is biased deeper into the class-A region only when an AC swing of $V_i$ is larger and therefore a higher power efficiency can be achieved.

In the appended claims, the output current $I_b$ is described as a "dynamic current," as its average level is adjusted dynamically in accordance with an AC swing of the first input signal $V_i$.

CGA1 is used to provide reverse isolation and mitigate a kickback from the second drain node DN2 to the first drain node DN1, and CGA2, when incorporated, can further improve reverse isolation and mitigate a kickback from the third drain node DN3 to the second drain node DN2. Concepts of "reverse isolation" and that "common-gate amplifier is good at providing reverse isolation" are well understood by those of ordinary skill in the art and thus not further explained in detail here.

The cascode amplifier 100 shown in FIG. 1 is a single-ended circuit embodiment; this is merely an example but not limitation. By adding a replica copy of the cascode amplifier 100 and applying respective complementary input signals (wherein a DC component is the same, while an AC component is inverted), one can construct a differential circuit embodiment. This will be obvious to those of ordinary skill in the art and thus not further explained in detail.

Now refer to FIG. 1. A purpose of the first capacitor C1 is to form a resonance with the first inductor L1 at a frequency of the first input signal $V_i$ to exhibit a high impedance and thus enlarge an AC swing of the third drain voltage $V_{d3}$. However, C1 is optional and may not be needed if a parasitic capacitance at the third drain node DN3 is readily adequate to form the resonance with the first inductor L1.

In a further embodiment, the cascode amplifier 100 includes a neutralization capacitor CN configured to couple a second input signal $$V_i',$$

which is an inversion of the first input signal $V_i$, to the first drain node DN1. The common-source amplifier CSA1 is an inverting amplifier, causing a first drain voltage $V_{d1}$ at the first drain node DN1 to be an inversion of the first input signal $V_i$. Since $$V_i'$$

is an inversion of $V_i$, the coupling of $$V_i'$$

to DN1 through the neutralization capacitor CN is in phase with the amplification of $V_i$ to DN1 via CSA1. The coupling through the neutralization capacitor CN, however, is inherently linear; therefore, an overall linearity can be improved.

In a further embodiment, the cascode amplifier 100 further comprises a dynamic gate voltage generator 120 configured to receive the first input signal $V_i$ and output the first gate voltage $V_{g1}$. A purpose of the dynamic gate voltage generator 120 is to make $V_{g1}$ higher when an AC swing of $V_i$ is larger to allow the first NMOST NM1 to have a larger headroom on its drain to mitigate linearity degradation due to channel length modulation. The dynamic gate voltage generator 120 is a peak detector circuit comprising a diode 121, a resistor 122, and a capacitor 123, wherein "$V_{dc2}$" denotes a second DC bias node; the topology and function of the peak detector circuit are well known in the prior art and thus not further explained. When an AC swing of $V_i$ is larger, its peak voltage will be higher, and $V_{g1}$ will be higher in average, causing $V_{d1}$ to be higher in average and the first common-source amplifier CSA1 to be more linear due to having a larger headroom to accommodate a larger AC swing.

For any given circuit comprising NMOST and/or PMOST, a function of said circuit remains the same if every NMOST is replaced with a PMOST, every PMOST is replaced with a NMOST, every power supply node is replaced with a ground node, and every ground node is replaced with a power supply node; in other words, NMOST and PMOST are swapped, and power supply node and ground node are also swapped. Therefore, in the appended claims, NMOST and PMOST are not explicitly stated; instead, "MOST of a first type" and "MOST of a second type" are stated; in one embodiment, "MOST of a first type" and "MOST of a second type" refer to NMOST and PMOST, respectively; in another embodiment, "MOST of a first type" and "MOST of a second type" refer to PMOST and NMOST, respectively. Likewise, power supply node and ground node are not explicitly stated; instead, "a first DC node" and "a second DC node" are used.

Figure 2:
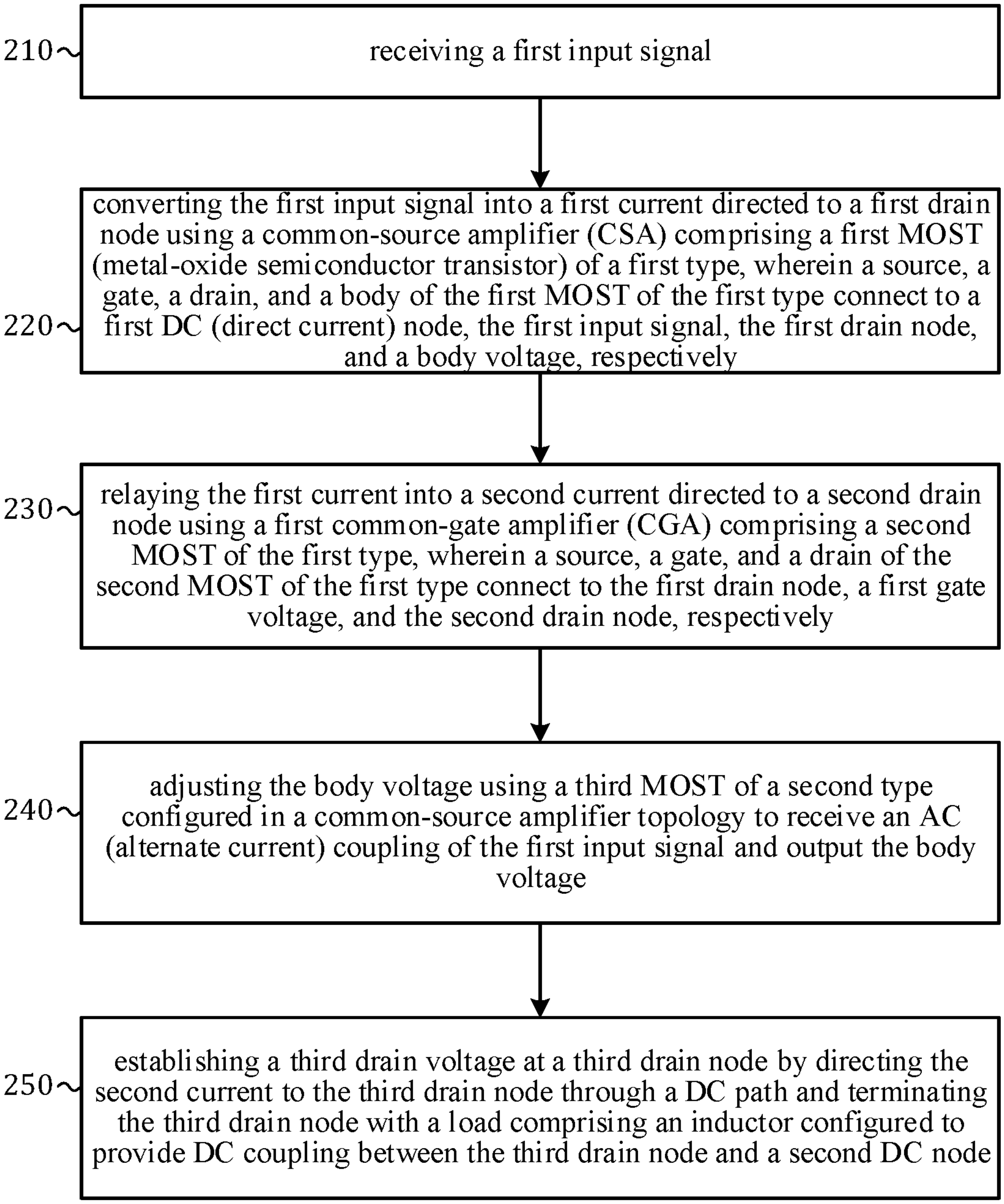
FIG. 2 shows a flow diagram of a method of signal amplification in accordance with an embodiment of the present invention.

As shown in a flow diagram shown in FIG. 2, a method in accordance with an embodiment of the present disclosure comprises: (step 210) receiving a first input signal; (step 220) converting the first input signal into a first current directed to a first drain node DN1 using a common-source amplifier (CSA) comprising a first MOST (metal-oxide semiconductor transistor) of a first type, wherein a source, a gate, a drain, and a body of the first MOST of the first type connect to a first DC (direct current) node, the first input signal, the first drain node, and a body voltage, respectively; (step 230) relaying the first current into a second current directed to a second drain node using a first common-gate amplifier (CGA) comprising a second MOST of the first type, wherein a source, a gate, and a drain of the second MOST of the first type connect to the first drain node, a first gate voltage, and the second drain node, respectively; (step 240) adjusting the body voltage using a third MOST of a second type configured in a common-source amplifier topology to receive an AC (alternate current) coupling of a second input signal and output the body voltage, wherein the second input signal is an inversion of the first input signal; and (step 250) establishing a third drain voltage at a third drain node by directing the second current to the third drain node through a DC (direct current) path and terminating the third drain node with a load comprising an inductor configured to provide DC (direct current) coupling between the third drain node and a second DC node.

Those skilled in the art will readily observe that numerous modifications and alterations of the device and method may be made while retaining the teachings of the disclosure.

Accordingly, the above disclosure should not be construed as limited only by the metes and bounds of the appended claims.

What is claimed is:

1. A cascode amplifier comprises:

a common-source amplifier (CSA) comprising a first MOST (metal-oxide semiconductor transistor) of a first type configured to receive a first input signal and output a first current to a first drain node in accordance with a body voltage applied at a body of the first MOST of the first type;

a first common-gate amplifier (CGA) comprising a second MOST of the first type and configured to receive the first current from the first drain node and output a second current to a second drain node in accordance with a first gate voltage;

a dynamic body voltage generator configured to receive the first input signal and output the body voltage; and a load configured to establish a third drain voltage at a third drain node in response to the second current through a DC (direct current) path between the second drain node and the third drain node, wherein:

the dynamic body voltage generator comprises a third MOST of a second type configured to output a dynamic current in accordance with the first input signal, and a first resistor configured to establish the body voltage in response to the dynamic current.

2. The cascode amplifier of claim 1, wherein the load is a resonant network configured to have a high impedance at a frequency of the first input signal.

3. The cascode amplifier of claim 2, wherein the load comprises an inductor configured to provide a DC coupling between the third drain node and a second DC node.

4. The cascode amplifier of claim 3 further comprising a capacitor connected in parallel with the inductor.

5. The cascode amplifier of claim 1, wherein a gate of the third MOST of the second type is coupled to the first input signal through an AC (alternating current) coupling capacitor, and DC coupled to a first bias node through a second resistor.

6. The cascode amplifier of claim 1, wherein the DC path comprises a short circuit inserted between the second drain node and the third drain node.

7. The cascode amplifier of claim 1, wherein the DC path comprises a second CGA comprising a fourth MOST of the first type and configured to relay the second current into a third current directed to the third drain node in accordance with a second gate voltage.

8. The cascode amplifier of claim 1 further comprising a neutralization capacitor configured to couple a second input signal to the first drain node, wherein the second input signal is an inversion of the first input signal.

9. The cascode amplifier of claim 1 further comprising a dynamic gate voltage generator configured to output the first gate voltage in accordance with an AC (alternate current) swing of the first input signal.

10. The cascode amplifier of claim 9, wherein the dynamic gate voltage generator comprises a peak detector configured to detect a peak of the first input signal and output the first gate voltage to represent the peak.

11. A method of signal amplification comprising:

receiving a first input signal;

converting the first input signal into a first current directed to a first drain node using a common-source amplifier (CSA) comprising a first MOST (metal-oxide semiconductor transistor) of a first type, wherein a source, a gate, a drain, and a body of the first MOST of the first type connect to a first DC (direct current) node, the first input signal, the first drain node, and a body voltage, respectively;

relaying the first current into a second current directed to a second drain node using a first common-gate amplifier (CGA) comprising a second MOST of the first type, wherein a source, a gate, and a drain of the second MOST of the first type connect to the first drain node, a first gate voltage, and the second drain node, respectively;

adjusting the body voltage using a third MOST of a second type configured in a common-source amplifier topology to receive an AC (alternate current) coupling of the first input signal and output the body voltage; and establishing a third drain voltage at a third drain node by directing the second current to the third drain node through a DC (direct current) path and terminating the third drain node with a load comprising an inductor configured to provide DC coupling between the third drain node and a second DC node.

12. The method of signal amplification of claim 11 further comprising coupling a second input signal to the first drain node using a neutralization capacitor, wherein the second input signal is an inversion of the first input signal.

13. The method of signal amplification of claim 11, wherein the DC path comprises a short circuit inserted between the second drain node and the third drain node.

14. The method of signal amplification of claim 11 further comprising relaying the second current into a third current directed to the third drain node using a second CGA comprising a fourth MOST of the first type, wherein a source, a gate, and a drain of the fourth MOST of the first type connect to the second drain node, a second gate voltage, and the third drain node.

15. The method of signal amplification of claim 11, wherein the load is configured to have a high impedance at a frequency of the first input signal.

16. The method of signal amplification of claim 11, wherein the load further comprises a capacitor connected in parallel with the inductor.

17. The method of signal amplification of claim 11 further comprising dynamically adjusting the first gate voltage in accordance with an AC swing of the first input signal.

18. The method of signal amplification of claim 17, wherein dynamically adjusting the first gate voltage comprising using a dynamic gate voltage generator that comprises a peak detector configured to detect a peak of the first input signal and output the first gate voltage to represent the peak.

19. The method of signal amplification of claim 11, wherein a source, a gate, and a drain of the third MOST of the second type connect to a second DC node, a third gate node, and the body of the first MOST of the first type, respectively, the drain is terminated with a first resistor, and the third gate node is AC coupled to the first input signal and DC coupled to a first bias node through a second resistor.

* * * * *